(12) United States Patent
Ide et al.

(10) Patent No.: US 7,867,922 B2
(45) Date of Patent: Jan. 11, 2011

(54) FILM FORMING METHOD FOR DIELECTRIC FILM

(75) Inventors: Shinji Ide, Amagasaki (JP); Yasuhiro Oshima, Santa Clara, CA (US); Yusaku Kashiwagi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 309 days.

(21) Appl. No.: 12/086,030

(22) PCT Filed: Dec. 5, 2006

(86) PCT No.: PCT/JP2006/324263

§ 371 (c)(1),
(2), (4) Date: Jun. 4, 2008

(87) PCT Pub. No.: WO2007/066658

PCT Pub. Date: Jun. 14, 2007

(65) Prior Publication Data

US 2009/0152686 A1    Jun. 18, 2009

(30) Foreign Application Priority Data

Dec. 5, 2005   (JP) ............................. 2005-350765

(51) Int. Cl.
*H01L 21/31*   (2006.01)
*H01L 21/469*  (2006.01)

(52) U.S. Cl. ........... 438/789; 118/723 R; 257/E21.273; 438/787; 438/788; 700/123; 700/181

(58) Field of Classification Search ............. 118/723 R; 257/E21.273; 438/787–789; 700/123, 181
See application file for complete search history.

(56) References Cited

U.S. PATENT DOCUMENTS

| | | | |
|---|---|---|---|
| 7,309,662 B1* | 12/2007 | Giles et al. | 438/780 |
| 7,531,891 B2* | 5/2009  | Ohto et al. | 257/634 |
| 7,642,650 B2* | 1/2010  | Sugiura et al. | 257/758 |
| 2002/0055275 A1 | 5/2002 | MacNeil | |
| 2004/0152334 A1 | 8/2004 | Ohto et al. | |
| 2004/0212114 A1 | 10/2004 | Kashiwagi et al. | |

FOREIGN PATENT DOCUMENTS

JP   2004-158794   6/2004

(Continued)

OTHER PUBLICATIONS

PCT Notification of Transmittal of Copies of Translation of the International Preliminary Examination Report (Form PCT/IB/338) dated Jan. 2004.
PCT International Preliminary Report on Patentability (Form PCT/IB/373) dated Jan. 2004.

(Continued)

*Primary Examiner*—Asok K Sarkar
(74) *Attorney, Agent, or Firm*—Smith, Gambrell & Russell, LLP

(57) ABSTRACT

The present invention is a film forming method for an SiOCH film, comprising a unit-film-forming step including: a deposition step of depositing an SiOCH film element by using an organic silicon compound as a raw material and by using a plasma CVD method; and a hydrogen plasma processing step of providing a hydrogen plasma process to the deposited SiOCH film element, wherein the unit-film-forming step is repeated several times so as to form an SiOCH film on a substrate.

7 Claims, 14 Drawing Sheets

FOREIGN PATENT DOCUMENTS

| | | |
|---|---|---|
| JP | 2004-221275 | 8/2004 |
| WO | 01/01472 | 1/2001 |
| WO | 2005/045916 | 5/2005 |

OTHER PUBLICATIONS

PCT Written Opinion of the International Searching Authority (Form/ISA/237) dated Apr. 2005.

* cited by examiner

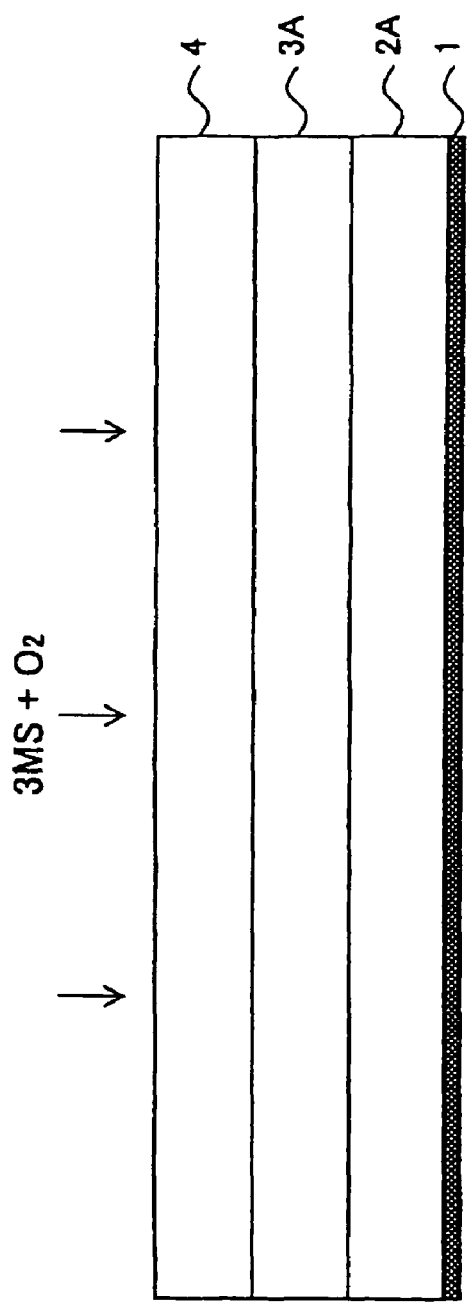
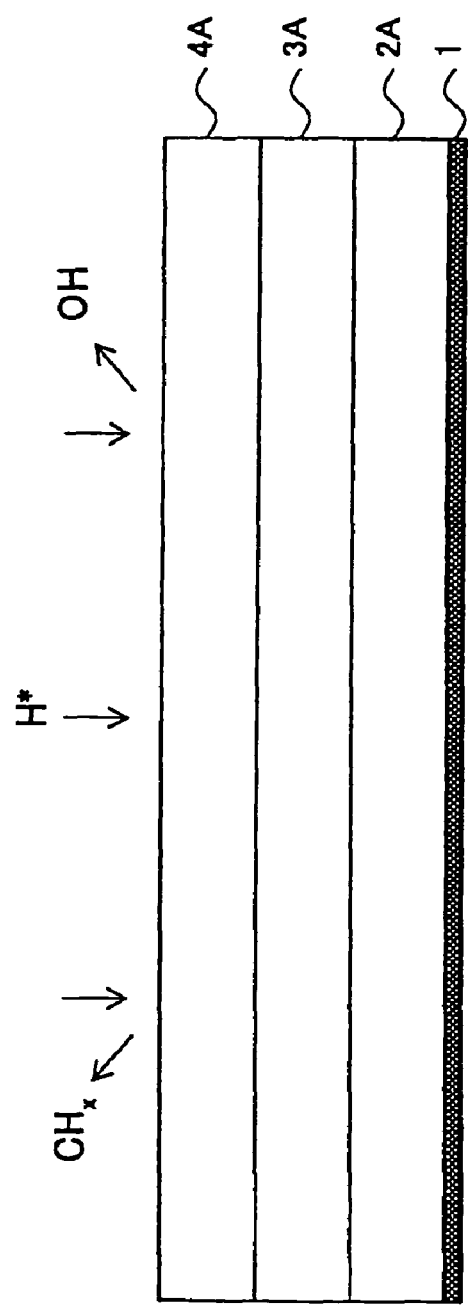
FIG. 2E
FIG. 2F

NO PRE-TREATMENT

O2 PRE-TREATMENT

FILM FORMING METHOD FOR DIELECTRIC FILM

BACKGROUND OF THE INVENTION

1. Field of the Invention

The present invention generally relates to a film forming method for a dielectric film, and in particular relates to a film forming method for a dielectric film having a low dielectric constant.

2. Background Art

In a semiconductor device that has been recently developed to have a relatively fine structure, the so-called multi-layer wiring structure is used for electrically connecting a great number of semiconductor elements formed on a substrate. In such a multi-layer wiring structure, interlayer insulating films, in each of which wiring patterns are embedded, are laminated in large numbers one on another. One layer of the wiring patterns is connected with another adjacent layer of the wiring patterns or diffusion region formed in the substrate, relative to each other, via a contact hole or holes formed through each interlayer insulating film.

In each interlayer insulating film of such a finely structured semiconductor device, complicated wiring patterns are formed adjacent to one another. Therefore, wiring delay of a signal due to parasitic capacitance in such an interlayer insulating film has been seriously problematic.

Therefore, especially, in the recent semiconductor device having a hyperfine structure on the order of the so-called sub-microns or sub-quarter-microns, a fluorinated silicon oxide film (i.e., SiOF film) having a relative dielectric constant of 3 to 3.5 is used as each interlayer insulating film for constituting the multi-layer wiring structure, in place of a conventional silicon oxide film (i.e., $SiO_2$ film) having the relative dielectric constant of approximately 4.

Even by the use of such an SiOF film, however, reduction of the relative dielectric constant has been limited. Namely, for the SiOF-based insulating film, it is difficult to achieve a relative dielectric constant of 3.0 or less that is required for a semiconductor device of a generation to be produced under a designing rule of 0.1 μm or less.

As an insulating film having a lower relative dielectric constant, i.e., the so-called low-k insulating film, various materials have been known. However, the interlayer insulating film used in the multi-layer structure is required to have not only such a lower relative dielectric constant but also high mechanical strength and excellent stability against a heating process.

An SiOCH film exhibits sufficient mechanical strength, and also it can achieve a relative dielectric constant of 2.5 or less. Besides, the SiOCH film can be formed by a CVD method that is convenient for a production process for the semiconductor device. Accordingly, the SiOCH film may be a promising material as a low-k interlayer insulating film to be used for an ultrahigh-speed semiconductor device for the next generation.

In WO2005/045916, a technique for forming a porous low-k film is described, wherein the SiOCH film formed by a plasma CVD method using an organic silane gas as a raw material is modified by a hydrogen plasma process, so that CHx groups and/or OH groups in the film can be released therefrom, thereby to reduce a film density thereof.

In the conventional multi-layer wiring structure, such a porous low-k film has been employed in layers located in the vicinity of the substrate of the device, in which fine wirings are formed in a higher density.

Recently, however, there is a demand for providing such a porous low-k film also in upper layers in which global wirings are formed. Generally, each interlayer insulating film, in which the global wiring is formed, has a film thickness of 1 μm or greater.

The interlayer insulating films constituting an upper layer portion of the multi-layer wiring structure are required to support a bonding pad. Therefore, these films should have not only a lower dielectric constant but also a higher modulus of elasticity. However, since the conventional low-k film or porous film has a lower modulus of elasticity, it is difficult to employ such a low-k film or porous film in the upper layer portion of the multi-layer wiring structure.

Besides, the low-k film or porous film, such as the SiOCH film or the like, used as a low-k interlayer insulating film, generally has a lower adhesiveness associated with its lower density. Accordingly, in the case of forming such a film on an etching stopper film, such as an SiC film, SiN film, SiCN film or SiCO film, it is likely to be peeled off from the etching stopper film.

SUMMARY OF THE INVENTION

The present invention was made in light of the above problems, and thus designed to solve these problems. Therefore, it is an object of this invention to provide a film forming method and a film forming apparatus for forming a low-k film having a significantly enhanced modulus of elasticity. Another object of this invention is to provide a multi-layer wiring structure or a semiconductor device including the low-k film produced by the film forming method. Still another object of this invention is to provide a film forming method and a film forming apparatus for forming a low-k film having a significantly enhanced adhesiveness.

The present invention is the film forming method, comprising a unit-film-forming step including: a deposition step of depositing an SiOCH film element by using an organic silicon compound as a raw material and by using a plasma CVD method; and a hydrogen plasma processing step of providing a hydrogen plasma process to the deposited SiOCH film element, wherein the unit-film-forming step is repeated several times so as to form an SiOCH film on a substrate.

According to this invention, the SiOCH film (or SiOCH porous film) to be used as an interlayer insulating film or the like is separately formed into a plurality of SiOCH film elements, and each of the SiOCH film elements is subjected to modification due to the hydrogen plasma process. Therefore, even when an SiOCH film (interlayer insulating film) having a considerably large thickness is formed as a whole, the modification can be securely provided up to the interior of the film. Accordingly, as compared with the case wherein the SiOCH film (interlayer insulating film) having the same thickness is formed by performing the deposition process only once and then performing the hydrogen plasma process only once, mechanical strength of the entire film, especially a modulus of elasticity, can be significantly enhanced.

In this way, since the SiOCH film (SiOCH porous interlayer insulating film) formed in accordance with this invention has excellent mechanical strength, a global wiring can be provided in the film by using a damascene method.

For example, in the deposition step of each unit-film-forming step, an SiOCH film element having a film thickness of 50 to 400 nm is deposited.

For example, in the deposition step of each unit-film-forming step, a temperature of the substrate is controlled to be a first substrate temperature within a range from a room temperature to 200° C., and in the hydrogen plasma processing step of each unit-film-forming step, the temperature of the substrate is controlled to be a second substrate temperature higher than the first substrate temperature.

For example, the deposition step of each unit-film-forming step is carried out by a first substrate processing apparatus, and the hydrogen plasma processing step of each unit-film-forming step is carried out by a second substrate processing apparatus.

In addition, in a case in which an insulating film selected from SiC, SiN, SiCN and SiCO is formed, in advance, on an upper surface of the substrate on which the SiOCH film is formed, it is preferred that an oxygen plasma step of providing an oxygen plasma process to a surface of the insulating film is performed before the first unit-film-forming step. In this case, since the surface of the insulating film is changed into a composition being rich in oxygen and having a higher electro-negativity, adhesiveness between the surface of the insulating film and the SiOCH film directly deposited thereon can be enhanced.

Preferably, between the deposition step and the hydrogen plasma processing step in each unit-film-forming step, an oxygen plasma step of providing an oxygen plasma process to a surface of the SiOCH film element deposited by the deposition step is performed.

Alternatively, the present invention is a multi-layer wiring structure comprising the SiOCH film formed by the above film forming method described above.

Alternatively, the present invention is a multi-layer wiring structure comprising an interlayer insulating film composed of a plurality of SiOCH porous films formed on an insulating film, wherein a wiring layer is formed in the interlayer insulating film.

For example, each of the plurality of SiOCH porous films has a film thickness of 50 to 400 nm.

For example, the wiring layer is formed in a groove formed in a laminating direction of the plurality of SiOCH porous films.

For example, the interlayer insulating film has a modulus of elasticity of 7.5 GPa or greater as a whole.

Alternatively, the present invention is a semiconductor device comprising a multi-layer wiring structure having any of the features described above.

Alternatively, the present invention is a film forming apparatus comprising: a deposition apparatus configured to deposit an SiOCH film element by using an organic silicon compound as a raw material and by using a plasma CVD method; a hydrogen plasma processing apparatus configured to provide a hydrogen plasma process to the deposited SiOCH film element; and an apparatus control unit configured to control the deposition apparatus and the hydrogen plasma processing apparatus, so as to carry out a film forming method for an SiOCH film, the method including a unit-film-forming step including: a deposition step of depositing the SiOCH film element by using the organic silicon compound as the raw material and by using the plasma CVD method; and a hydrogen plasma processing step of providing the hydrogen plasma process to the deposited SiOCH film element, wherein the unit-film-forming step is repeated several times so as to form an SiOCH film on a substrate.

Alternatively, the present invention is a storage medium storing a computer program to cause a computer to carry out a control method, wherein the control method is for controlling a film forming apparatus, the film forming apparatus including: a deposition apparatus configured to deposit an SiOCH film element by using an organic silicon compound as a raw material and by using a plasma CVD method; and a hydrogen plasma processing apparatus configured to provide a hydrogen plasma process to the deposited SiOCH film element, wherein the control method is for controlling the deposition apparatus and the hydrogen plasma processing apparatus, so as to carry out a film forming method for an SiOCH film, the film forming method including a unit-film-forming step including: a deposition step of depositing the SiOCH film element by using the organic silicon compound as the raw material and by using the plasma CVD method; and a hydrogen plasma processing step of providing the hydrogen plasma process to the deposited SiOCH film element, wherein the unit-film-forming step is repeated several times so as to form an SiOCH film on a substrate.

BRIEF DESCRIPTION OF THE DRAWINGS

FIGS. 2E and 2F are also diagrams for explaining the film forming method according to the first embodiment of the present invention;

BEST MODE FOR CARRYING OUT THE INVENTION

First Embodiment

Figure 3:
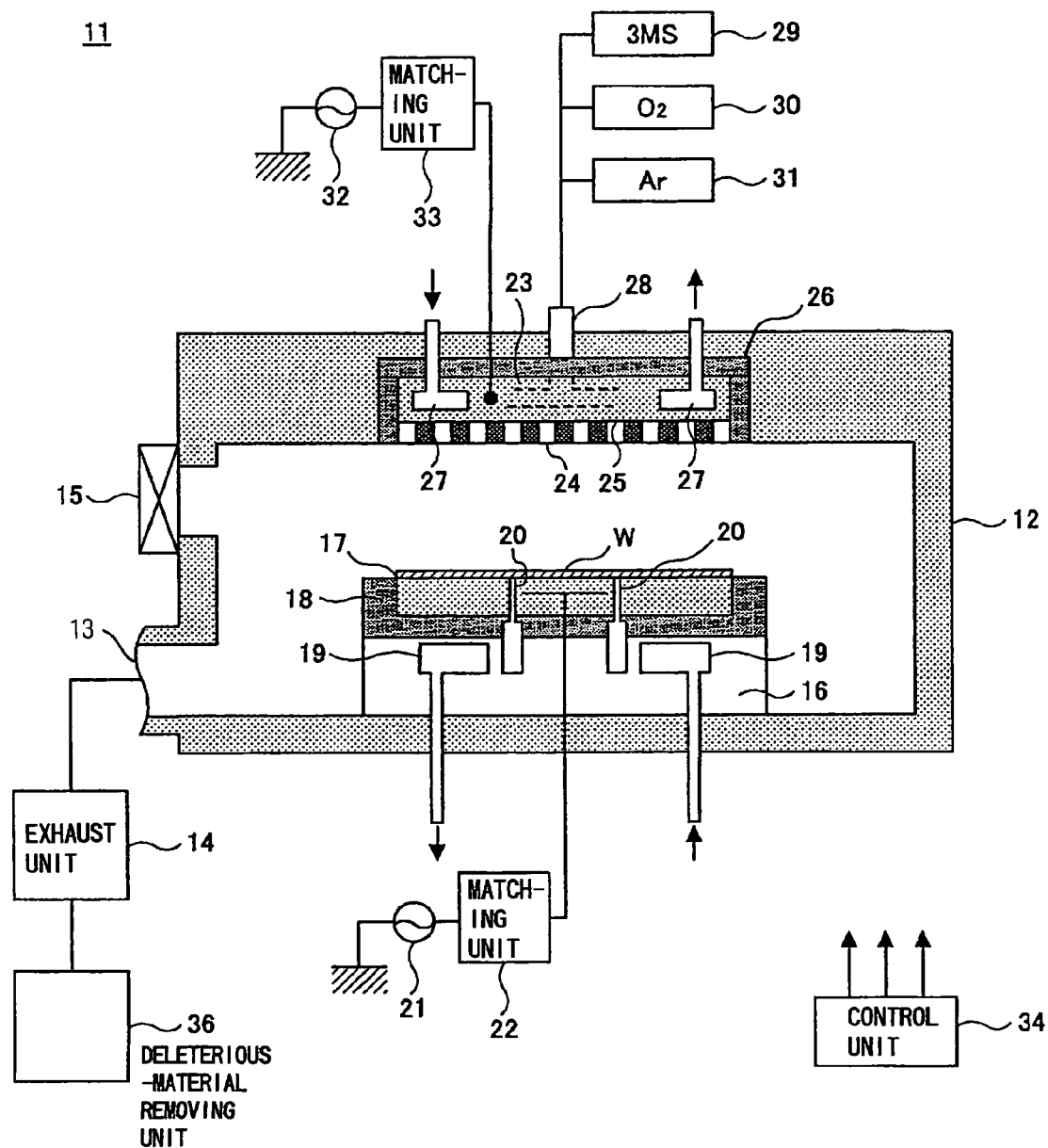
FIG. 3 is a diagram showing a construction of a substrate processing apparatus employed for deposition of an SiOCH film element, for the film forming method according to the first embodiment of the present invention.

FIGS. 1A to 1D and FIGS. 2E and 2F are diagrams for explaining a film forming method according to a first embodiment of the present invention. FIG. 3 is a diagram showing a construction of a parallel-plate type plasma substrate processing apparatus employed for deposition of an SiOCH film element, in the film forming method according to the first embodiment of the present invention.

Figure 1A:
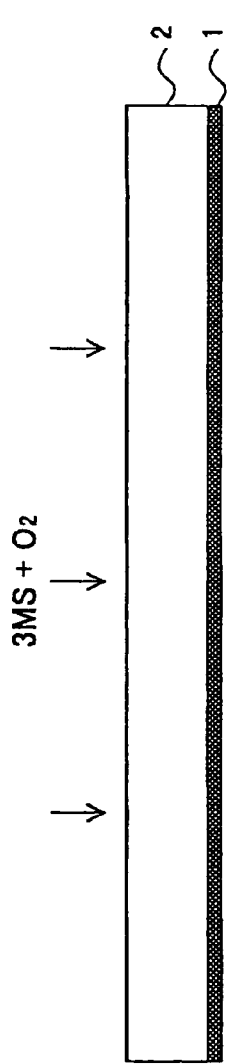
FIGS. 1A to 1D are diagrams for explaining a film forming method according to a first embodiment of the present invention.

As shown in FIG. 1A, an SiOCH film element 2 is formed to have a film thickness of approximately 400 nm, on a non-oxide insulating film 1, such as SiC, SiN or the like, by using the parallel-plate type plasma substrate processing apparatus 11 and by supplying a trimethylsilane (3MS) gas, i.e., an organic silicon compound gas, as a raw material gas, together with an oxygen gas. It is noted that the insulating film 1 has an etching selectivity with respect to the SiOCH film element 2. In addition, below the insulating film 1, an optional structure, such as a silicon substrate or the like, is provided.

As shown in FIG. 3, the parallel-plate type plasma substrate processing apparatus 11 includes a processing vessel 12 composed of an electrically conductive material, such as aluminum, which has been subjected to an anodic oxidation. The internal atmosphere of the processing vessel 12 can be evacuated, as needed, by an exhaust unit 14, such as a turbo-molecular pump, via an exhaust port 13. A susceptor 17 adapted for supporting a substrate W to be processed, such as a semiconductor wafer, LCD substrate, glass substrate or the like, is provided in the processing vessel 12, while being supported on a substantially cylindrical susceptor supporting table 16. The susceptor 17 is also configured to function as a lower electrode of the parallel-plate type plasma substrate processing apparatus 11. Between the susceptor 17 and the susceptor supporting table 16, an insulator 18 formed of a ceramic or the like is provided. In addition, the processing vessel 12 is grounded.

In the susceptor supporting table 16, a coolant fluid passage 19 is provided. Thus, the susceptor 17 and the substrate W to be processed, which is placed on the susceptor 17, are controlled to be a desired temperature, due to circulation of a coolant flown through the coolant fluid passage 19, upon processing the substrate.

A gate valve 15 is provided at a side wall of the processing vessel 12. While the gate valve 15 is opened, the substrate W to be processed is carried into or carried out from the processing vessel 12.

The exhaust unit 14 is further connected with a deleterious-material removing unit 36. The deleterious-material removing unit 36 has a function to make harmless an exhaust gas discharged from the processing vessel 12 via the exhaust unit 14. For example, the deleterious-material removing unit 36 is adapted to burn and/or pyrolyze the atmospheric gas in the presence of a predetermined catalyst so as to make it harmless.

In the susceptor supporting table 16, lifter pins 20 for transferring the substrate W to be processed are provided such that they can be raised and lowered by an elevating mechanism (not shown). In addition, a convex disk-like portion is formed at a central portion of an upper surface of the susceptor 17. Additionally, an electrostatic chuck (not shown), which has a shape corresponding to the substrate W to be processed, is provided in the convex disk-like portion. The substrate W placed on the susceptor 17 is electrostatically chucked by the electrostatic chuck when a direct current voltage is applied to the electrostatic chuck.

A first high-frequency power source 21 is connected with the susceptor 17 via a first matching device 22. The first high-frequency power source 21 is configured to apply a high-frequency power of a frequency within a range of, for example, from 0.1 to 5 MHz. Due to the application of the high-frequency power from the high-frequency power source 21 to the susceptor 17, a plasma process to the substrate W to be processed can be promoted. However, such a feature described in regard to the high-frequency power source 21 is not critical herein.

Additionally, a shower head 23 is provided above the susceptor 17, such that the shower head 23 is arranged to be substantially parallel to the susceptor 17 and opposed to the substrate W to be processed, which is placed on the susceptor 17. On a surface of the shower head 23 opposed to the susceptor 17, an electrode plate 25 is provided, which is formed of aluminum or the like, and in which a plurality of gas supply holes 24 are formed. The shower head 23 is supported, at a ceiling portion of the processing vessel 12, by an electrode supporting member 26. In the interior of the shower head 23, another coolant fluid passage 27 is formed. Thus, the shower head 23 can be kept at a desired temperature, due to circulation of a coolant flown through the coolant fluid passage 27, upon processing the substrate.

To the shower head 23, a gas introducing pipe 28 is connected. The gas introducing pipe 28 is in turn connected with a trimethylsilane supply source 29 containing therein a trimethylsilane (3MS: $(CH_3)_3SiH$) raw material, an oxygen gas supply source 30 containing therein an oxygen gas, and an Ar gas supply source 31 containing therein an argon (Ar) gas, via respective mass flow controllers, valves or the like, which are not shown.

The raw material gas and/or the process gas contained in the respective gas supply sources 29 to 31 can be supplied into a hollow portion (not shown) formed in the shower head 23, via the gas introducing pipe 28, and then mixed together therein. Then, the mixed gas is supplied into a processing space located in the vicinity of a surface of the substrate W to be processed, via the gas supply holes 24 of the shower head 23.

Furthermore, a second high-frequency power source 32 is connected to the shower head 23 via a second matching device 33. The second high-frequency power source 32 is configured to supply a second high-frequency power of a frequency within a range of from 13 to 150 MHz to the shower head 23. Due to the supply of the second high-frequency power of such a high frequency, the shower head 23 can function as an upper electrode. Thus, a high-density plasma can be formed in the processing vessel 12.

The parallel-plate type plasma substrate processing apparatus 11 shown in FIG. 3 includes a control unit 34 configured to control the entire operation of the processing apparatus 11. The control unit 34 is composed of a micro-computer control device equipped with an MPU (Micro Processing Unit) and/or a memory unit. In this case, a program for controlling each part of the parallel-plate type plasma substrate processing apparatus 11 in accordance with a predetermined processing sequence is stored in the memory unit, so that each part of the parallel-plate type plasma substrate processing apparatus 11 can be controlled in accordance with the program.

In a step shown in FIG. 1A, a processing pressure in the processing vessel 12 is set at 100 Pa, a substrate temperature is set at 25° C., and the trimethylsilane (3MS) gas, the oxygen gas and the Ar gas are supplied at flow rates of 100 sccm, 100 sccm and 600 sccm, respectively. In addition, a second high-frequency power of 250 W is supplied at a frequency of 27.12 MHz. Consequently, an SiOCH film element 2 is deposited at a deposition speed of 680 nm/min.

The SiOCH film element 2 formed in the above manner incorporates therein a great amount of organic functional groups, such as $CH_3$ groups, $CH_2$ groups, and/or OH groups. Thus, the SiOCH film element 2 can exhibit a relative dielectric constant of 4.0 or less, typically within a range of from 3.0 to 4.0.

Figure 4:
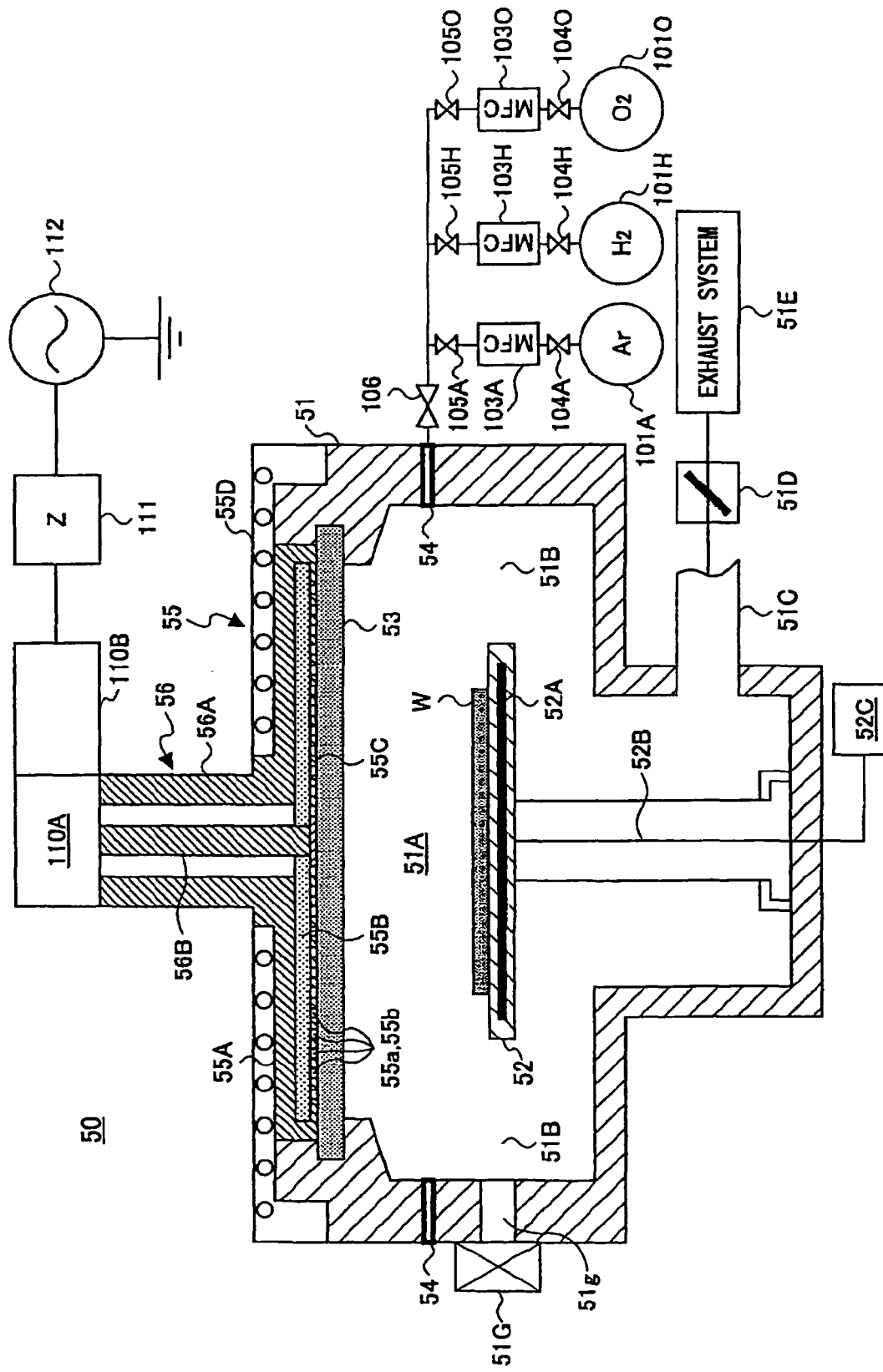
FIG. 4 is a diagram showing a construction of a substrate processing apparatus employed for modification of an SiOCH film element, for the film forming method according to the first embodiment.
Figure 5:
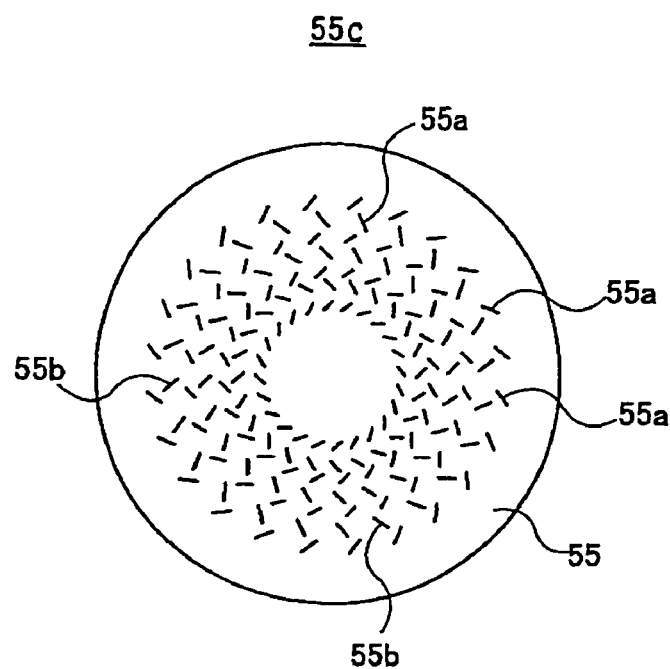
FIG. 5 is a front view of a flat antenna plate in the substrate processing apparatus of FIG. 4.

Subsequently, in the present embodiment, in a step shown in FIG. 1B, the substrate W to be processed, which has a structure shown in FIG. 1A, is processed by means of plasma-excited hydrogen radicals, by using a microwave plasma processing apparatus 50 as shown in FIGS. 4 and 5, in order to modify the SiOCH film, thereby forming a porous film 2A of an SiOCH composition.

As shown in FIG. 4, the microwave plasma processing apparatus 50 includes a processing vessel 51 having a processing space 51A formed therein. In the processing space 51A of the processing vessel 51, a substrate supporting table 52 adapted for supporting the substrate W to be processed is provided. The processing vessel 51 is connected with an APC 51D that is a pressure control mechanism as well as connected with an exhaust system 51E, via an exhaust port 51C. Thus, an atmosphere of a space 51B provided to surround the substrate supporting table 52 can be evacuated through the APC 51D and the exhaust system 51E.

A heater 52A is provided in the substrate supporting table 52. The heater 52A is configured to be driven by a power source 52C via a drive line 52B.

A substrate transfer port 51g and a gate valve 51G configured to be actuated in cooperation with the transfer port 51g are provided at the processing vessel 51. In this way, the substrate W to be processed can be carried into or carried out from the processing vessel 51 via the substrate transfer port 51g.

At a top portion of the processing vessel 51, an opening is formed, corresponding to a position on which the substrate W to be processed is placed. The opening is closed by a ceiling plate 53 formed of quarts glass. In a side wall of the processing vessel 51 located above the substrate supporting plate 52, a gas ring 54 is embedded. The gas ring 54 has a gas inlet provided on its outer circumferential side, and has multiple nozzle openings, each provided in communication with the gas inlet, on its inner circumferential side. The multiple nozzle openings of the gas ring 54 are arranged with an approximately equal interval.

The ceiling plate 53 serves as a microwave window. At a top portion of the ceiling plate 53, a substantially flat microwave antenna 55, which is adapted to function as a radial line slot antenna, is provided. It is also contemplated herein that a horn antenna may be employed in place of the microwave antenna.

As described above, in the example shown in FIG. 4, the microwave antenna 55 that can function as the radial line slot antenna is employed. More specifically, the microwave antenna 55 includes a substantially flat conductor portion 55A and a flat antenna plate 55C. The flat antenna plate 55C is provided on an open side of the substantially flat conductor portion 55A, via a slow-wave plate 55B formed of quartz or aluminum. As shown in FIG. 5, the flat antenna plate 55C includes multiple slots 55a, 55b formed therein.

The microwave antenna 55 is coupled to a coaxial waveguide 56 composed of an external waveguide 56A and an internal waveguide 56B. More specifically, the external waveguide 56A is connected with the conductor portion 55A of the microwave antenna 55, and the internal waveguide 56B is connected with the flat antenna plate 55C while extending through the slow-wave plate 55B.

The internal waveguide 56B is connected with a waveguide 110B having a rectangular cross section, via a mode converter 110A. The waveguide 110B is coupled with a microwave supply source 112 via an impedance matching device 111. In this manner, a microwave generated in the microwave supply source 112 can be supplied to the microwave antenna 55 via the rectangular waveguide 110B and the coaxial waveguide 56.

In addition, in the construction shown in FIG. 4, a cooling unit 55D is provided for the conductor portion 55A.

Referring now to FIG. 5, the construction of the radial line slot antenna will be explained in details. FIG. 5 is a front view of the flat antenna plate 55C. In the example shown in FIG. 5, the slots 55a, 55b of the flat antenna plate 55c are respectively formed into elongated grooves. Adjacent two slots 55a, 55b forming one pair are oriented in substantially orthogonal directions relative to each other (so as to form a substantially T-like shape). In addition, such pairs (or combinations) of slots 55a, 55b are arranged in three circles located concentrically relative to one another. Furthermore, relatively short slots are arranged inside those T-shaped pairs of slots, in a circle, while each being oriented in an inclined direction.

When the microwave is supplied to such a radial line slot antenna from the coaxial waveguide 56, the microwave is propagated throughout the antenna while radially spreading. At this time, the microwave is subjected to wavelength compression due to the slow-wave plate 55B. Then, the microwave is radiated from the slots 55a, 55b as a circularly polarized wave, in a direction substantially vertical to the flat antenna plate 55C.

In addition, as shown in FIG. 4, in the microwave plasma processing apparatus 50, a rare-gas supply source 101A for, for example, Ar or the like, a hydrogen-gas supply source 101H, and an oxygen-gas supply source 101O are connected to the gas ring 54, via their own mass flow controllers (MFC) 103A, 103H, 103O, their own valves 104A, 104H, 104O, 105A, 105H, 105O, and a common valve 106, respectively. As described above, the gas ring 54 has the multiple gas introducing ports formed uniformly therein along the circumferential direction of the substrate supporting table 52. Thus, the Ar gas, the hydrogen gas and the oxygen gas can be introduced uniformly into the processing space 51A in the processing vessel, respectively.

Upon an operation of the microwave plasma processing apparatus 50, the processing space 51A in the processing vessel 51 is evacuated via the exhaust port 51C so as to be set at a predetermined pressure. At the same time, the hydrogen gas and/or the oxygen gas are introduced into the processing space 51A, together with the Ar gas, from the gas ring 54. In this case, another rare gas, such as Kr, Xe, or Ne, may be used in place of the Ar gas.

Thereafter, the microwave of a frequency of several GHz, for example, 2.45 GHz, is introduced into the processing space 51A, via the microwave antenna 55, from the microwave supply source 112. As a result, a high-density plasma, on the order of $10^{11}$ to $10^{13}/cm^3$ plasma density, can be excited in the vicinity of the surface of the substrate W to be processed.

The plasma excited by the microwave introduced via the antenna as described above is characterized by a relatively low electron temperature within a range of from 0.2 to 7 eV or less. Thus, in the microwave plasma processing apparatus 50, damage that would be otherwise exerted on the substrate W to be processed as well as on the inner wall of the processing vessel 51 can be avoided. In addition, since the radicals formed in association with the plasma excitation can be flown along the surface of the substrate W to be processed and eliminated immediately from the processing space 51A, mutual recombination of such radicals can be suppressed. Accordingly, even at a low temperature of 450° C. or less, a significantly uniform and effective process can be provided to the substrate.

Figure 1B:
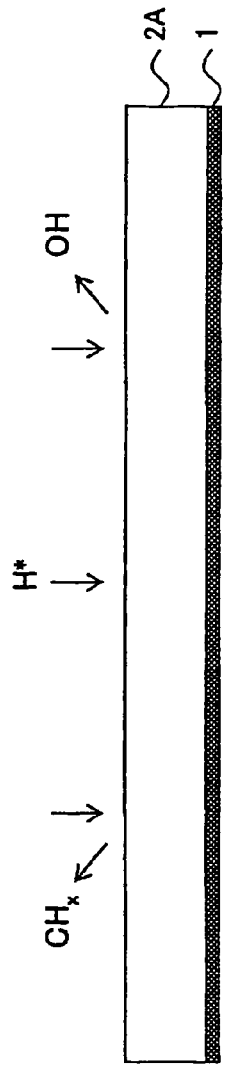

For a step shown in FIG. 1B, the substrate W to be processed having the structure as shown in FIG. 1A is first introduced into the processing vessel 51 of the microwave plasma processing apparatus 50 as described above. Then, the microwave plasma processing apparatus 50 provides a modifying process to the SiOCH film element 2, over four minutes, while supplying the hydrogen gas at a flow rate of 1000 sccm and the Ar gas at 500 sccm, under a pressure of 267 Pa and at a substrate temperature of 400° C., as well as supplying the microwave of a 2.45 GHz frequency with power of 2000 W.

As a result of such a modifying process, the organic functional groups and/or the OH groups incorporated in the SiOCH film element 2 can be substituted with hydrogen radicals. Eventually, since the substituted organic functional groups (CHx) and/or OH groups are released from the processed material, the SiOCH film element 2 is transformed into an SiOCH porous film element 2A.

The so-obtained SiOCH porous film element 2A has a relative dielectric constant of 2.0 to 2.5.

Figure 1C:
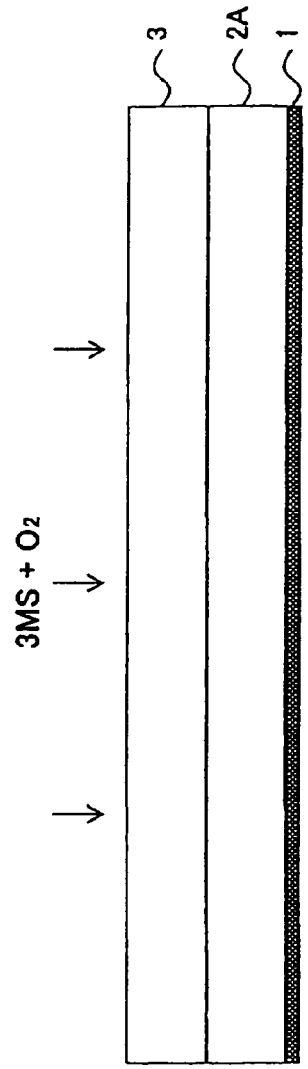

Next, in a step shown in FIG. 1C, a next SiOCH film element 3 similar to the SiOCH film element 2 is formed on the SiOCH porous film element 2A, in the same manner as that shown in FIG. 1A, so as to have a film thickness of approximately 400 nm.

Figure 1D:
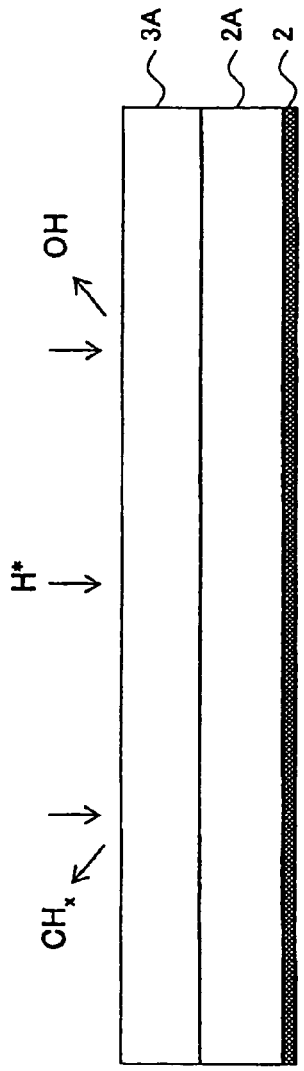

Thereafter, in a step shown in FIG. 1D, the modifying process is provided to the SiOCH film element 3, in the same manner as that shown in FIG. 1B. Consequently, an SiOCH porous film element 3A is formed.

Furthermore, in a step shown in FIG. 2E, a next SiOCH film element 4 similar to the SiOCH film element 2 is formed on the SiOCH porous film element 3A, in the same manner as that shown in FIG. 1A, so as to have a film thickness of approximately 400 nm.

Subsequently, in a step shown in FIG. 2F, the modifying process is provided to the SiOCH film element 4, in the same manner as that shown in FIG. 1B. As a result, an SiOCH porous film element 4A can be obtained.

Figure 6:
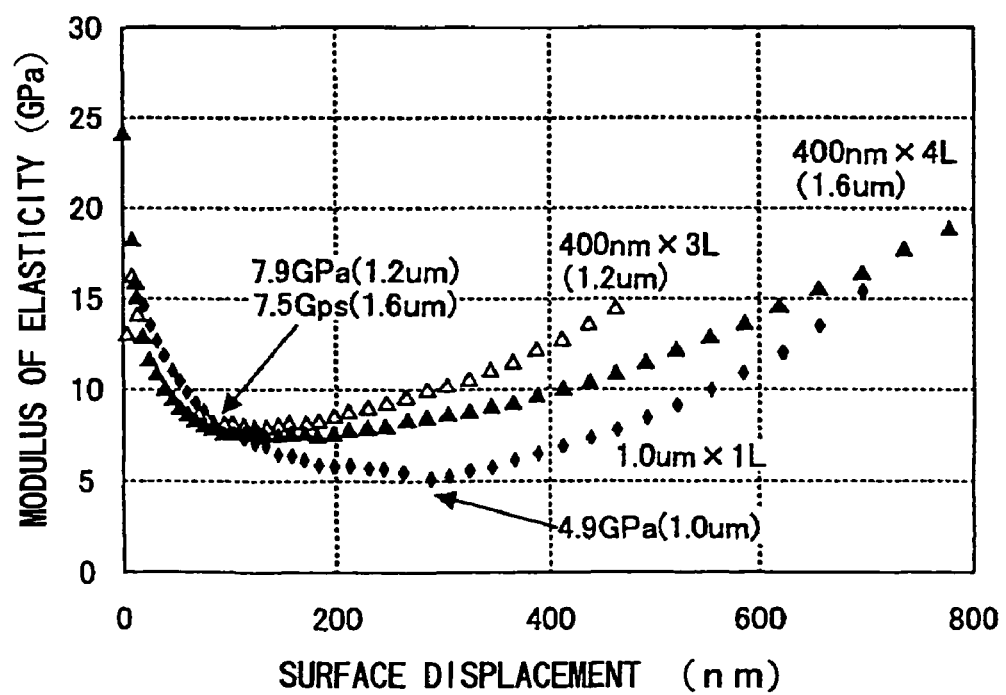
FIG. 6 is a graph showing mechanical strength of an SiOCH porous film obtained by the film forming method according to the first embodiment of the present invention.

FIG. 6 is a graph showing mechanical strength of the SiOCH porous film having a triple-layered structure formed in this way. The mechanical strength of each film was measured in accordance with a nano-indentation method. An example of the triple-layered structure corresponds to data (Δ) expressed by "400 nm×3 L", and the whole film thickness is 1.2 µm.

In FIG. 6, data (♦) expressed by "1.0 µm×1 L" corresponds to the SiOCH porous film having a single-layered structure, while data (▲) expressed by "400 nm×4 L" corresponds to the SiOCH porous film having a quadruple-layered structure (in this case, the whole film thickness is 1.6 µm).

In each of the cases shown in FIG. 6, the film forming process and the modifying process were performed in the same manner as in the case discussed with reference to FIGS. 1A and 1B. It is noted that, in FIG. 6, the vertical axis designates a pressing force while the horizontal axis designates a penetrating depth of an indenter.

According to the graph shown in FIG. 6, in the case of the single-layered SiOCH film having the film thickness of 1.0 µm, a modulus of elasticity of the film is 4.9 GPA, while the modulus of elasticity is increased up to 7.9 GPa in the case of the laminated film of the triple-layered structure having the whole film thickness of 1.2 µm. Furthermore, the modulus of elasticity is increased up to 7.5 GPa in the case of the quadruple-layered film having the whole thickness of 1.6 µm.

As is seen from the results of FIG. 6, in the case of forming the SiOCH porous film by using the plasma CVD process and the hydrogen plasma modifying process, through the formation of relatively thin SiOCH film elements one on another while providing the hydrogen plasma modifying process to each formed SiOCH film element, the modulus of elasticity of the entire film can be significantly enhanced, even when a relatively thick SiOCH porous film having the whole thickness greater than 1 µm is formed. The reason is considered that by laminating and processing each thin film element, the hydrogen plasma process of FIG. 1B can penetrate up to the interior of the film.

It is noted that, in each step shown in FIGS. 1A to 2F, it is preferred that the film thickness of each formed SiOCH film element is within a range of from 50 to 400 nm. For example, if the thickness of the SiOCH film element formed in each film forming step shown in FIG. 1A, 1C or 2E would be increased greater than 400 nm, the hydrogen plasma process would not sufficiently penetrate into the film, thus degrading the modulus of elasticity of the entire film obtained. Contrary, if the film thickness of each formed SiOCH film element is less than 50 nm, the relative dielectric constant would be unduly increased because excessively fine and high-density structure would be formed by the plasma process.

Second Embodiment

Figure 7:
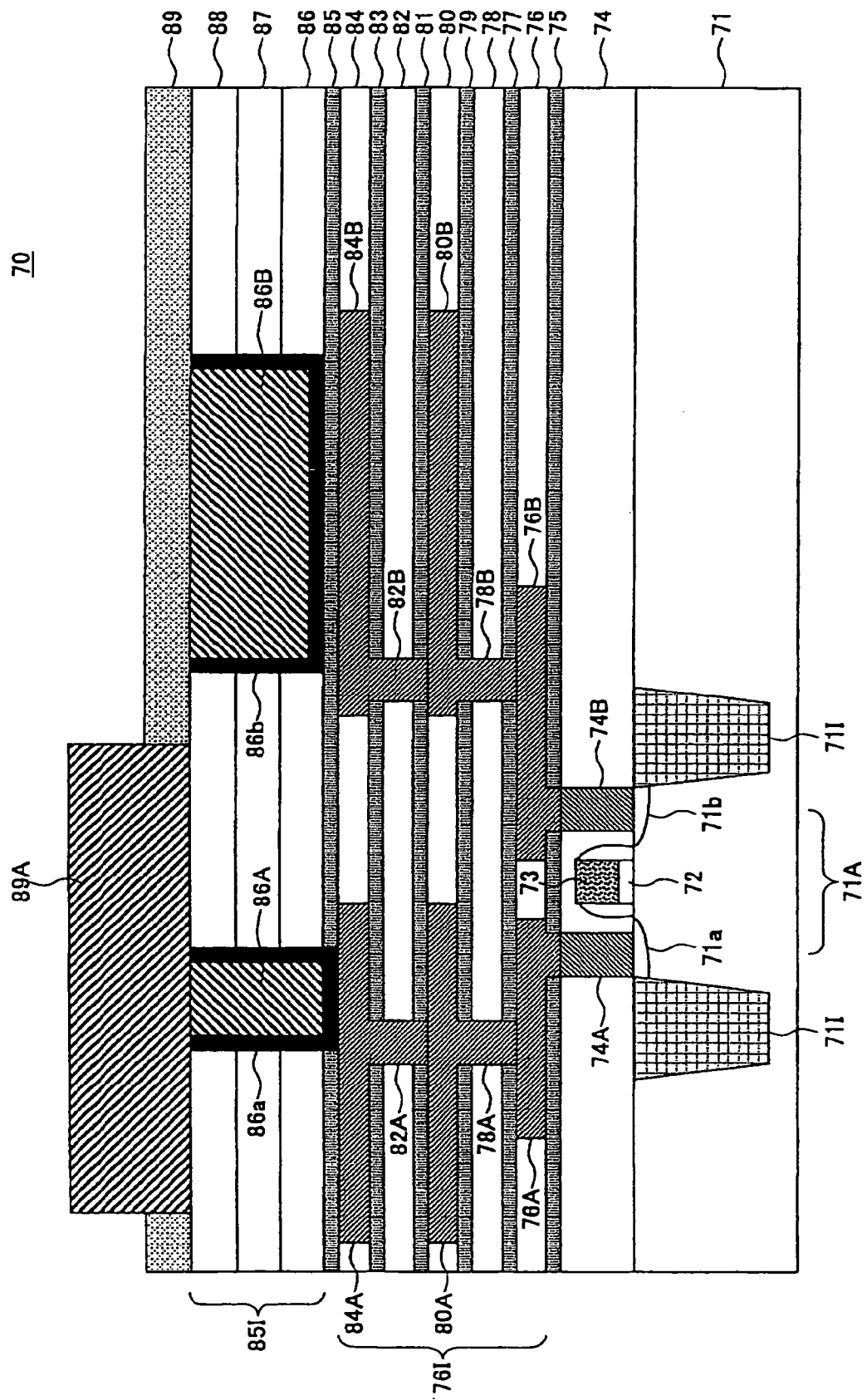
FIG. 7 is a cross section view showing construction of a semiconductor device obtained by a film forming method according to a second embodiment of the present invention.

FIG. 7 is a cross section view showing construction of a semiconductor device 70 obtained by a film forming method according to a second embodiment of the present invention.

As shown in FIG. 7, the semiconductor device 70 includes a silicon substrate 71. In the silicon substrate 71, an element region 71A composed of a p-type or n-type well is formed by element separating structures 71I of an STI (shallow trench isolation) type. In the element region 71A, a gate electrode 73 is formed on a surface of the silicon substrate 71 via a gate insulating film 72.

In the silicon substrate 71 on both sides of the gate electrode 73, diffusion regions 71a, 71b of a reverse conducting type relative to the aforementioned well are formed respectively. The diffusion regions 71a, 71b constitute a transistor together with the gate insulating film 72 and gate electrode 73.

In addition, on the silicon substrate 71, a silicon oxide film 74, such as TEOS or the like, is formed to cover the gate electrode 73. In the silicon oxide film 74, W plugs 74A, 74B are formed, respectively corresponding to the diffusion regions 71a, 71b.

On the silicon oxide film 74, etching stopper films 75, 77, 79, 81, 83, 85, each formed from SiC, SiN, SiCN, SiOC or the like, and low-k interlayer insulating films 76, 78, 80, 82, 84, each composed of an organic insulating film, an SiOCH film and/or a porous film of them, are laminated alternatively.

In the interlayer insulating film 76, Cu wiring patterns 76A, 76B, respectively contacting with the W plugs 74A, 74B, are formed (wherein the Cu wiring patterns 76A, 76B extend through the etching stopper film 75, respectively). In the interlayer insulating film 80, Cu wiring patterns 80A, 80B, respectively contacting with the Cu wiring patterns 76A and 76B, are formed by a dual-damascene method. The Cu wiring pattern 80A includes a via-plug portion 78A, which extends through the etching stopper film 79, the interlayer insulating film 78 and the etching stopper film 77 so as to contact with the Cu wiring pattern 76A. Similarly, the Cu wiring pattern 80B includes a via-plug portion 78B, which extends through the etching stopper film 79, the interlayer insulating film 78 and the etching stopper film 77 so as to contact with the Cu wiring pattern 76B.

Similarly, in the interlayer insulating film 84, Cu wiring patterns 84A, 84B, respectively contacting with the Cu wiring patterns 80A and 80B, are formed by a dual-damascene method. The Cu wiring pattern 84A includes a via-plug portion 82A, which extends through the etching stopper film 83, the interlayer insulating film 82 and the etching stopper film 81 so as to contact with the Cu wiring pattern 80A. Again, the Cu wiring pattern 84B includes a via-plug portion 82B, which extends through the etching stopper film 83, the interlayer insulating film 82 and the etching stopper film 81 so as to contact with the Cu wiring pattern 80B.

In this way, the Cu wiring patterns 76A, 76B constitute together one of wiring layers of a multi-layer wiring structure 76I, the Cu wiring patterns 80A, 80B (including the via-plugs 78A, 78B) constitute together another wiring layer, and the Cu wiring patterns 84A, 84B (including the via-plugs 82A, 82B) constitute together yet another wiring layer.

Typically, each interlayer insulating film 76, 78, 80, 82, 84 has a thickness of approximately 100 nm. Thus, each Cu wiring pattern 76A, 76B, 80A, 80B, 84A, 84B (including each via-plug 78A, 78B, 82A, 82B) extending in such an insulating film is patterned under a designing rule of 100 nm or less, for example, 90 nm.

In FIG. 7, no barrier-metal film is shown in regard to the respective Cu wiring patterns (including the Cu via-plugs). However, in an actual structure, a barrier-metal film, formed from a high-melting-point metal, such as Ta or the like, or a combination of such a high-melting-point metal and an electrically conductive nitride thereof, such as Ta/N or the like, is provided to each Cu wiring pattern.

In the semiconductor device shown in FIG. 7, the etching stopper film 85 consisting of SiC, SiN, SiCN or SiON is formed on the interlayer insulating film 84. On the etching stopper film 85, SiOCH porous films 86 to 88, each having a film thickness of 50 to 400 nm, are laminated one on another, in the same manner as in the steps shown in FIGS. 1A to 2F, so as to form an insulating film 85I.

In the insulating film 85I, Cu wiring patterns or Al wiring patterns 86A, 86B, each constituting a global wiring, are formed by using the damascene method, under a designing rule of, for example, 290 nm, via barrier metal films 86a, 86b. This designing rule is not so strict as that employed for the multi-layer wiring structure 76I.

The uppermost SiOCH porous film 88 is covered with an SiN passivation film 89. In this case, the etching stopper film 85 shown in FIG. 7 corresponds to the insulating film 1 shown in FIG. 1A. In addition, the SiOCH porous films (interlayer insulating films) 86, 87, 88 shown in FIG. 7 correspond to the SiOCH porous films 2A, 3A, 4A shown in FIGS. 1A to 2F, respectively.

An opening for exposing the wiring pattern 86A is formed in a part of the passivation film 89. In this opening, an Al electrode pad 89A is provided.

According to the embodiment as described above, the insulating film 85I is formed of a laminate that is composed of the three layered SiOCH porous films 86 to 88. Therefore, the insulating film 85I has a significantly great mechanical strength as described with reference to FIG. 6. Accordingly, the insulating film 85I can bear therein a global wiring to which an electrode pad is connected.

Third Embodiment

FIGS. 8A to 8C, FIGS. 9D to 9F and FIGS. 10G to 10I are diagrams for explaining a film forming method according to a third embodiment of the present invention. In these drawings, like parts described above will be designated by like reference numerals or characters, and description on those parts will be omitted below.

Figure 8A:
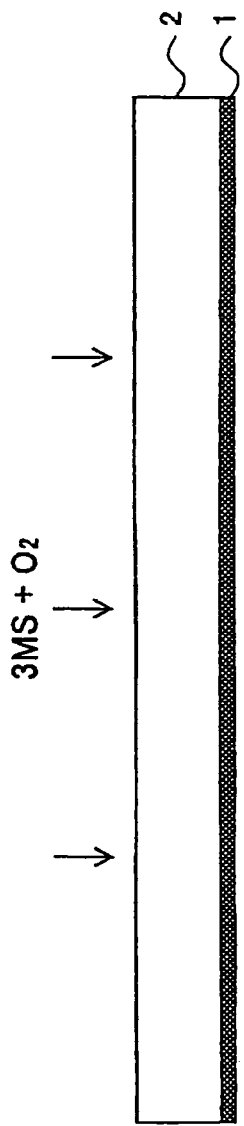
FIGS. 8A to 8C are diagrams for explaining a film forming method according to a third embodiment of the present invention.

A step shown in FIG. 8A corresponds to the step shown in FIG. 1A. Namely, the SiOCH film element 2 is formed on the insulating film 1, by using the plasma CVD method, under the same conditions as previously described with reference to FIG. 1A.

Figure 8B:
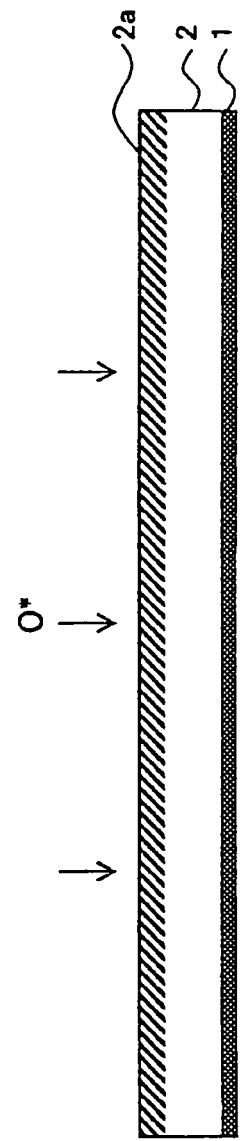

Next, in a step shown in FIG. 8B, the supply of the trimethylsilane gas is stopped. Thereafter, in the parallel-plate type plasma substrate processing apparatus 11 shown in FIG. 3, for example, under a pressure of 1000 Pa and at a substrate temperature of 25° C., the oxygen gas is supplied at the flow rate of 100 sccm and the Ar gas is supplied at the flow rate of 600 sccm, to the surface of the SiOCH film element 2. In addition, a high frequency of 27.12 MHz is supplied to the shower head 23 with power of 250 W. In this manner, the oxygen plasma process can be performed. As a result, a densification layer 2a having a thickness of approximately 10 nm and rich in oxygen is formed.

Thereafter, in a step shown in FIG. 8C, the hydrogen plasma process is provided to the substrate to be processed, which has a structure as shown in FIG. 8B, under the same conditions as described with reference to FIG. 1B. Consequently, the SiOCH film element 2 is modified, with the densification layer 2a left intact on the surface thereof, so as to be transformed into the porous film 2A.

Figure 8C:
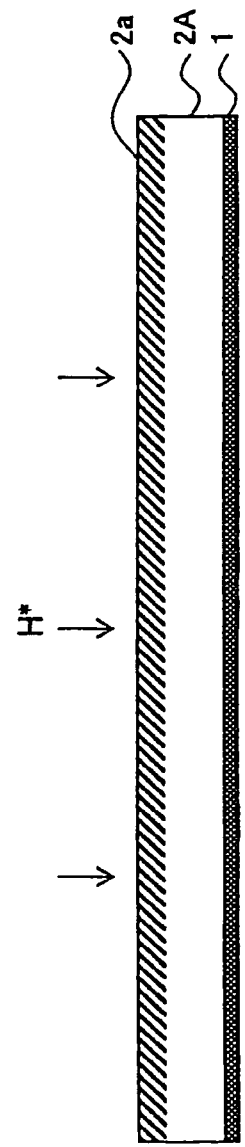

In this embodiment, during the modifying step shown in FIG. 8C, organic functional groups (CHx) and/or OH groups can be released from the SiOCH film element 2, only at a controlled rate, via the densification layer 2a. That is, contraction of the SiOCH film element 2 associated with the release of the organic functional groups and/or the OH groups can be suppressed. Thus, a low-k film having a significantly lower density can be achieved.

Figure 9D:
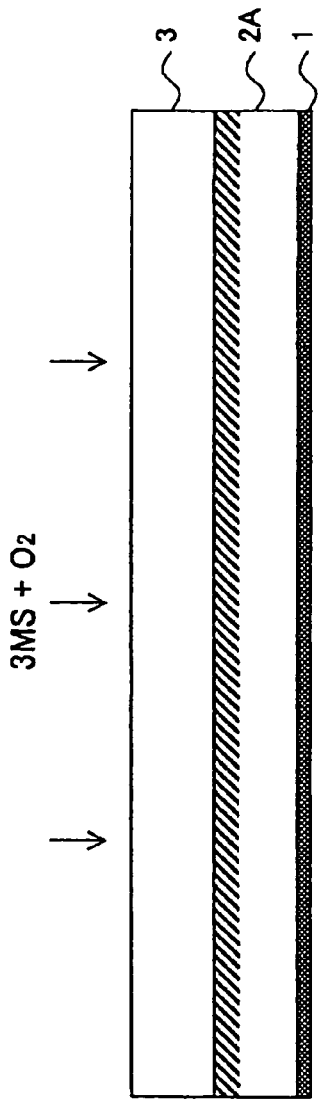
FIGS. 9D to 9F are also diagrams for explaining the film forming method according to the third embodiment of the present invention.
Figure 9E:
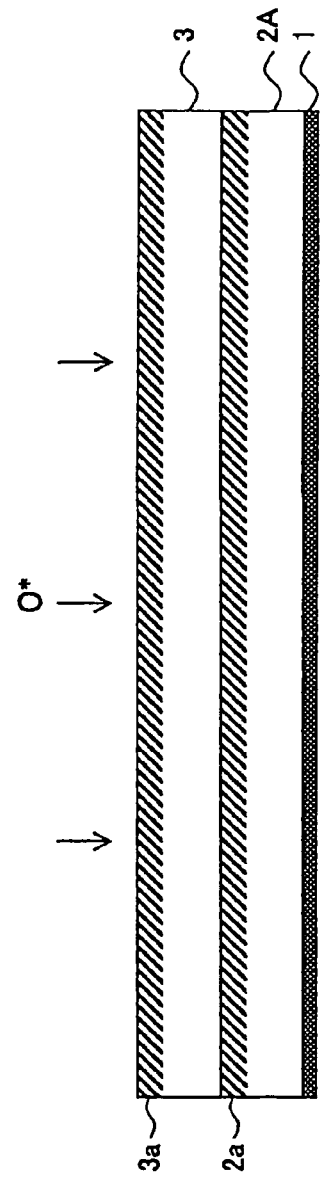
Figure 9F:
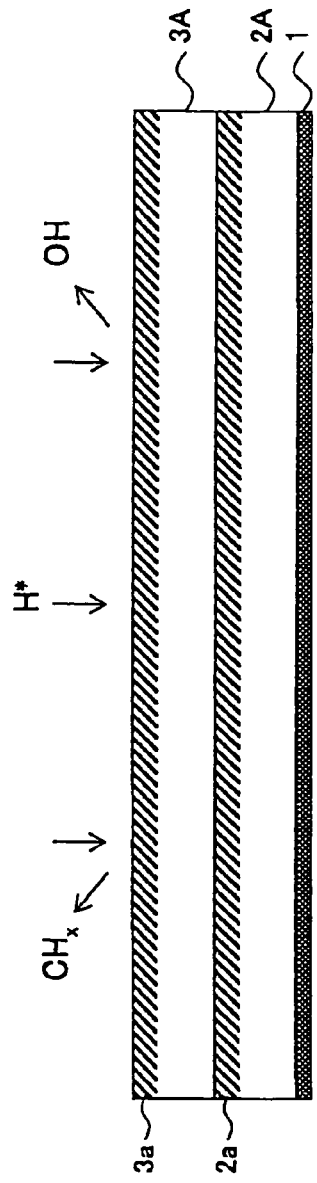
Figure 10G:
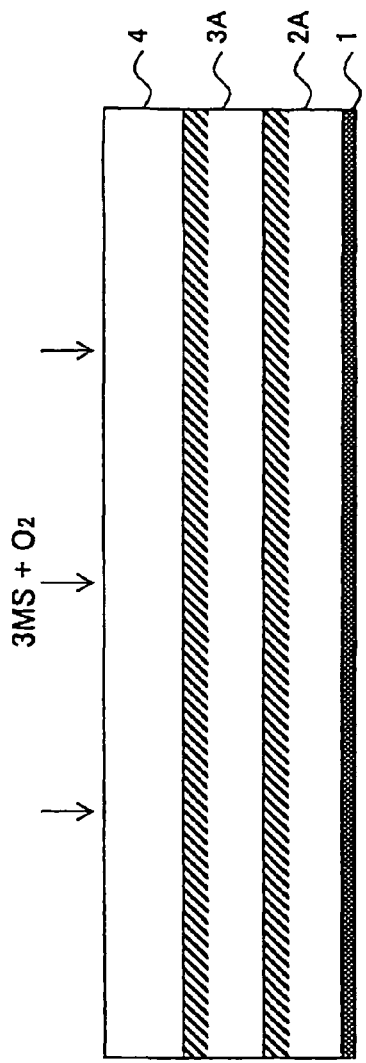
FIGS. 10G to 10I are also diagrams for explaining the film forming method according to the third embodiment of the present invention.
Figure 10H:
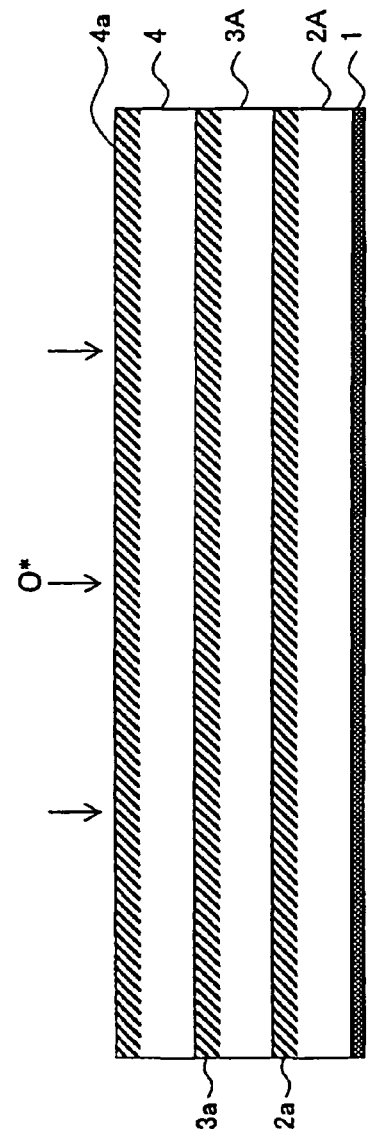
Figure 10I:
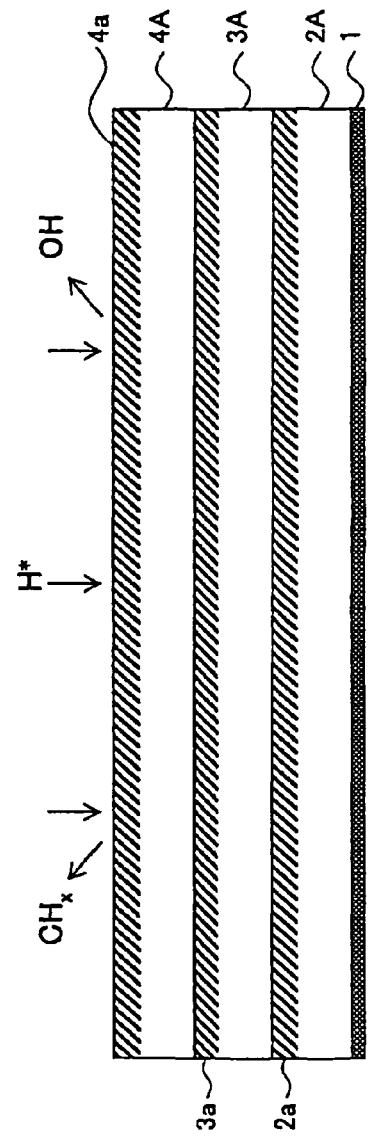

Again, in steps shown in FIGS. 9D to 9F, the processes respectively shown in FIGS. 8A to 8C are repeated for the substrate to be processed, which has a structure as shown in FIG. 8C. Furthermore, in steps shown in FIGS. 10G to 10I, the processes respectively shown in FIGS. 8A to 8C are repeated for the substrate to be processed, which has now a structure as shown in FIG. 9F.

According to this embodiment, upon forming holes (voids) by utilizing the hydrogen plasma process, the contraction of the SiOCH film can be suppressed. Besides, with the repetition of the formation of such an SiOCH porous film, the SiOCH porous film can be significantly excellent in mechanical strength, as described above with reference to FIG. 6.

Fourth Embodiment

Figure 11A:
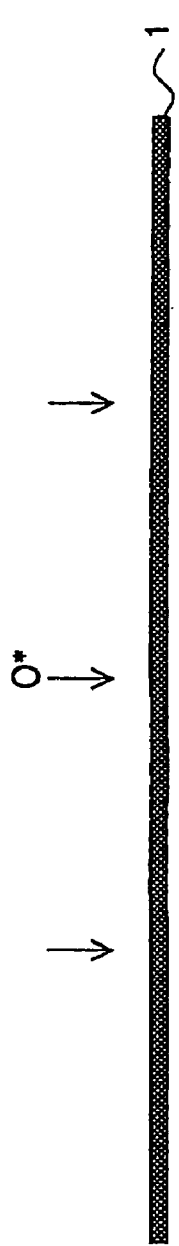
FIGS. 11A to 11C are diagrams for explaining a film forming method according to a fourth embodiment of the present invention.
Figure 11B:
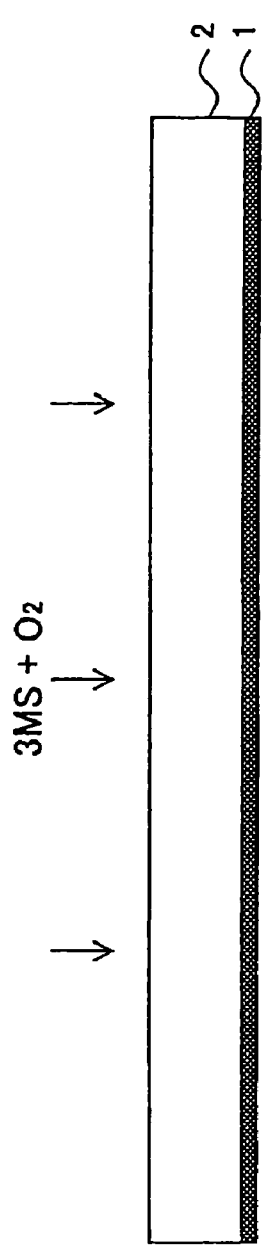
Figure 11C:
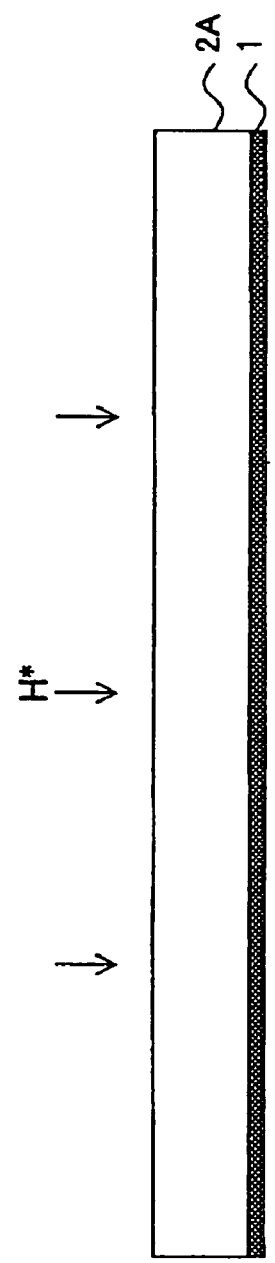

FIGS. 11A to 11C are diagrams for explaining a film forming method according to a fourth embodiment of the present invention. In these drawings, like parts described above will be designated by like reference numerals or characters, and description on those parts will be omitted below.

A step shown in FIG. 11B corresponds to the step shown in FIG. 1A, and a step shown in FIG. 11C corresponds to the step shown in FIG. 1B.

As shown in a step shown in FIG. 11A, this embodiment is characterized by providing an oxygen plasma process to a surface of the insulating film 1 formed from SiC, SiN, SiCN or SiOC, in the parallel-plate type plasma substrate processing apparatus 11 as shown in FIG. 3, as a pre-treatment for the step shown in FIG. 11B (corresponding to the step shown in FIG. 1A). After the oxygen plasma process, the steps shown in FIGS. 11B and 11C, i.e., the steps respectively shown in FIGS. 1A and 1B, are performed in succession.

Figure 12:
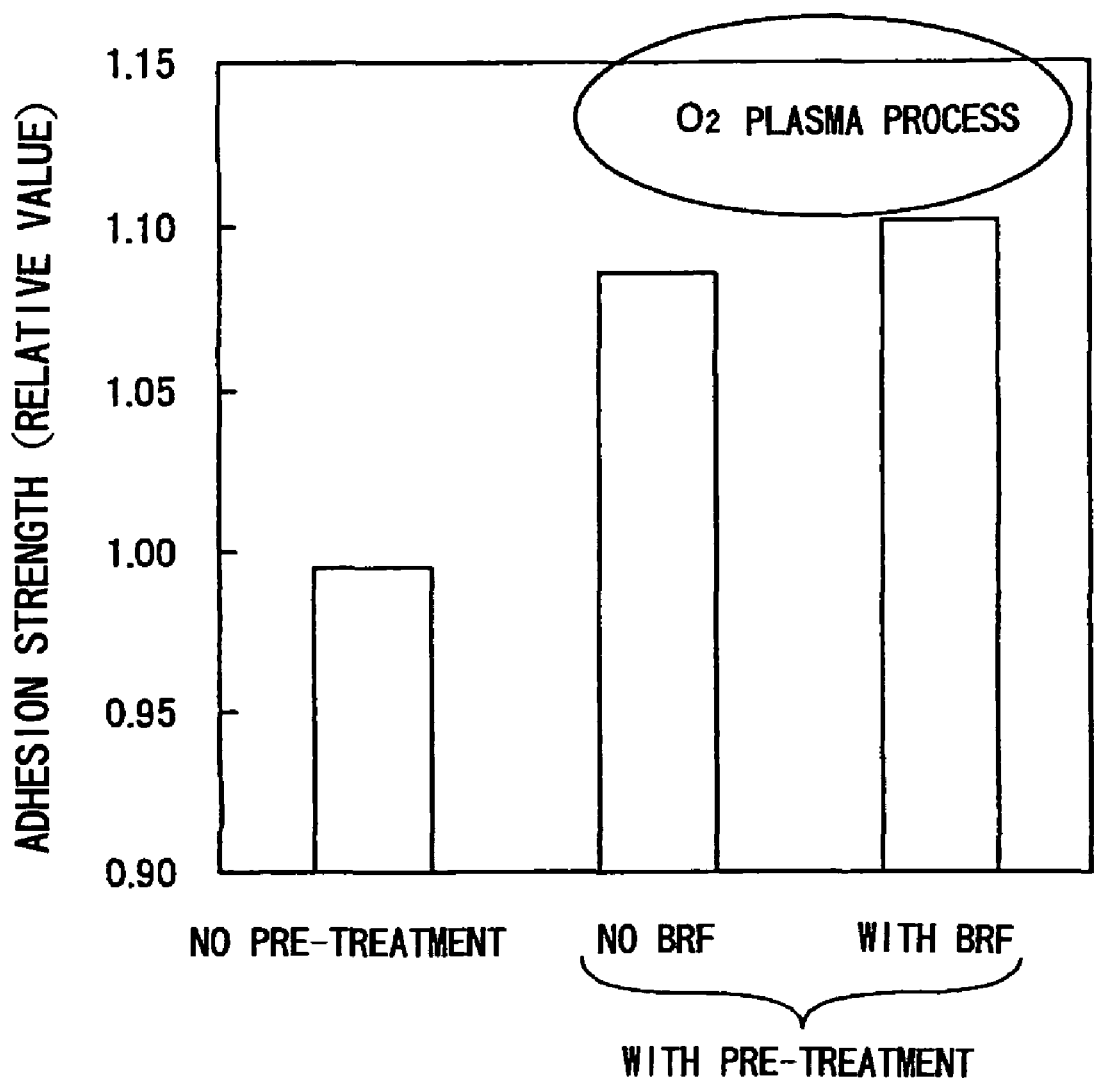
FIG. 12 is a graph showing adhesion strength of an SiOCH film obtained by the film forming method according to the fourth embodiment of the present invention.

FIG. 12 shows adhesion strength in the case of the SiOCH porous film obtained by this embodiment and in the case in which the pre-treatment step shown in FIG. 11A was omitted. In FIG. 12, a sample designated by "No pre-treatment" corresponds to the case (experiment) in which the pre-treatment shown in FIG. 11A was not performed. Meanwhile, the samples respectively designated by "No BRF" and "With BRF" correspond to the case in which no bias was applied to the substrate and the case in which the bias was applied thereto, during the oxygen plasma process shown in FIG. 11A, respectively. It is noted that the adhesion strength was measured in accordance with an m-ELT (modified edge lift-off test) method.

With respect to more specific processing conditions for the experiment designated by "No BRF", the step shown in FIG. 11A was performed, for 30 seconds, by using the parallel-plate type plasma substrate processing apparatus 11 shown in FIG. 3, with the oxygen gas supplied to the apparatus 11 at a flow rate of 200 sccm as well as with the power of 500 W supplied to the shower head 23 at a high frequency of 27.12 MHz, under a pressure of 267 Pa and at a substrate temperature of 45° C. During this process, the high-frequency power was not supplied to the susceptor 17.

Contrary, in the experiment designated by "With BRF", the step shown in FIG. 11A was performed, while applying a high-frequency substrate bias of 2 MHz to the susceptor 17 with the power of 50 W. The other conditions were the same as in the experiment designated by "No BRF".

As is seen from results shown in FIG. 12, according to the pre-treatment shown in FIG. 11A prior to the deposition process shown in FIG. 11B, the adhesion strength of the SiOCH porous film 2A to the insulating film 1 can be enhanced by about 10%, as compared with the case in which the pre-treatment was not performed. Besides, in the case in which such a pre-treatment is performed, the application of the substrate bias can further enhance the adhesion strength.

Figure 13A:
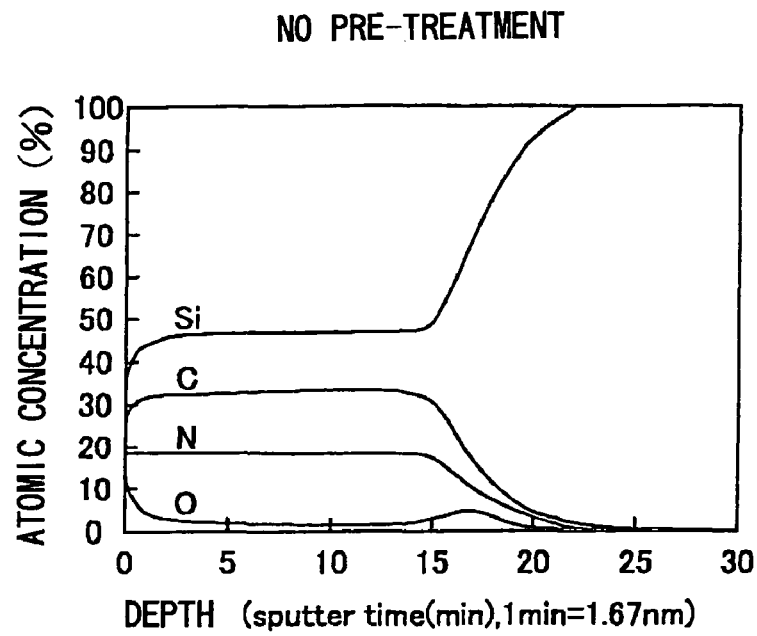
FIG. 13A is a graph showing element distribution profile in a base film of a comparison.
Figure 13B:
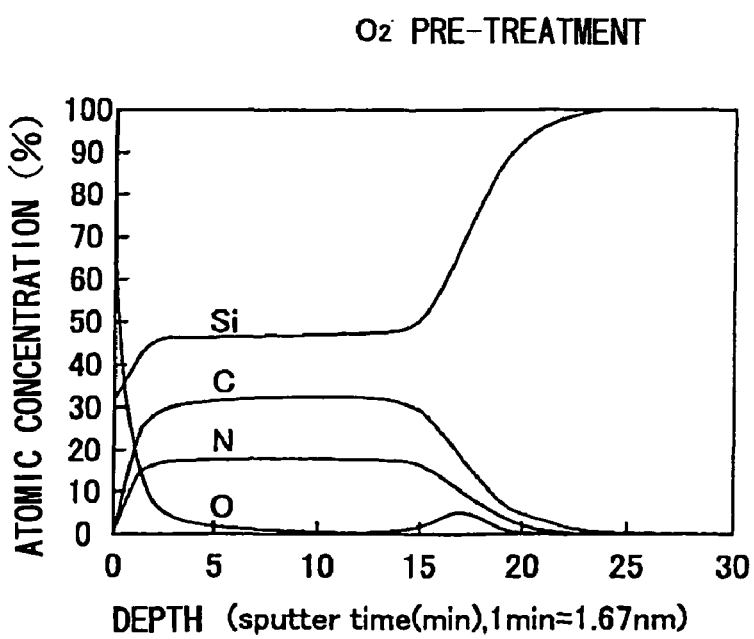
FIG. 13B is a graph showing element distribution profile in a base film of the fourth embodiment of the present invention.

FIG. 13A is a graph showing a profile of XPS (element distribution) in a surface portion of the insulating film 1 (base film) of the case in which the pre-treatment of FIG. 11A was not performed (comparison). FIG. 13B is a graph showing a profile of XPS (element distribution) in a surface portion of the insulating film 1 (base film) of the case in which the pre-treatment of FIG. 11A was performed (fourth embodiment).

In FIGS. 13A and 13B, the vertical axis designates each atomic concentration of Si, carbon, nitrogen and oxygen, while the horizontal axis designates a depth measured from the film surface. It is noted that, in each experiment shown in FIGS. 12, 13A and 13B, the base insulating film 1 is formed from a commercially available SiCN film.

In the case in which the pre-treatment was not performed, as is seen from FIG. 13A, slight elevation of the oxygen concentration in the substrate surface portion can be seen (i.e., a naturally oxidized film is present therein). Contrary, in the case in which the pre-treatment shown in FIG. 11A was performed, as is seen from FIG. 13B, marked increase of the oxygen concentration in the substrate surface portion can be seen, as well as drastic decrease of the carbon concentration and of the nitrogen concentration can be observed. This demonstrates that the surface portion of the insulating film 1 formed from the SiCN film includes a layered region of a composition similar to $SiO_2$, which is rich in oxygen and thus includes a great number of Si—O bonds, and that Si—C bonds and/or Si—N bonds are almost completely removed or eliminated from there.

The electro-negativity of Si is 1.8, while the electro-negativity of C is 2.5, and the electro-negativity of nitrogen is 3.0. On the other hand, the electro-negativity of oxygen is 3.5. Thus, it can be seen that the Si—O bond is more electrically active than the Si—C bond and the Si—N bond. The enhancement of the adhesion strength, described with reference to FIG. 12, in regard to the SiOCH porous film 2A, due to the pre-treatment shown in FIG. 11A, can be attributed to such compositional characteristics as describe above.

Accordingly, for example, in the case of producing the structure as shown in FIG. 7, it is preferred to provide an oxygen plasma process to the surface of the etching stopper film 85, prior to the deposition of the SiOCH film 86 thereon. Doing so can enhance the adhesion strength of the insulating film 85I. In this case, the etching stopper film 85 is not limited to the SiCN film, but it may be an SiC film, an SiN film or an SiCO film.

It is contemplated that the step shown in FIG. 11A may not be necessarily performed by the parallel-plate type plasma substrate processing apparatus that is the same apparatus as used for the deposition step shown in FIG. 11B, but it may be performed by utilizing another substrate processing apparatus.

Similarly, the hydrogen plasma process (see FIGS. 1B, 1D, 1F, 11C, etc.) described in regard to each of the above embodiments may not be necessarily performed by the microwave plasma processing apparatus shown in FIGS. 4 and 5. For instance, each hydrogen plasma process may also be performed by using the parallel-plate type plasma substrate processing apparatus 11 shown in FIG. 3. In such a case, since the plasma processing step should be performed at a substrate temperature different from that employed in the deposition step for the SiOCH film, it is preferred to employ the so-called cluster-type substrate processing system including two parallel-plate type plasma substrate processing apparatuses 11 combined together in a vacuum substrate carrying chamber. Alternatively, a cluster-type substrate processing system may also be constituted by combining the parallel-plate type plasma substrate processing apparatus 11 shown in FIG. 3 and the microwave plasma processing apparatus 50 shown in FIG. 4 together in a vacuum substrate carrying chamber.

Fifth Embodiment

Figure 14:
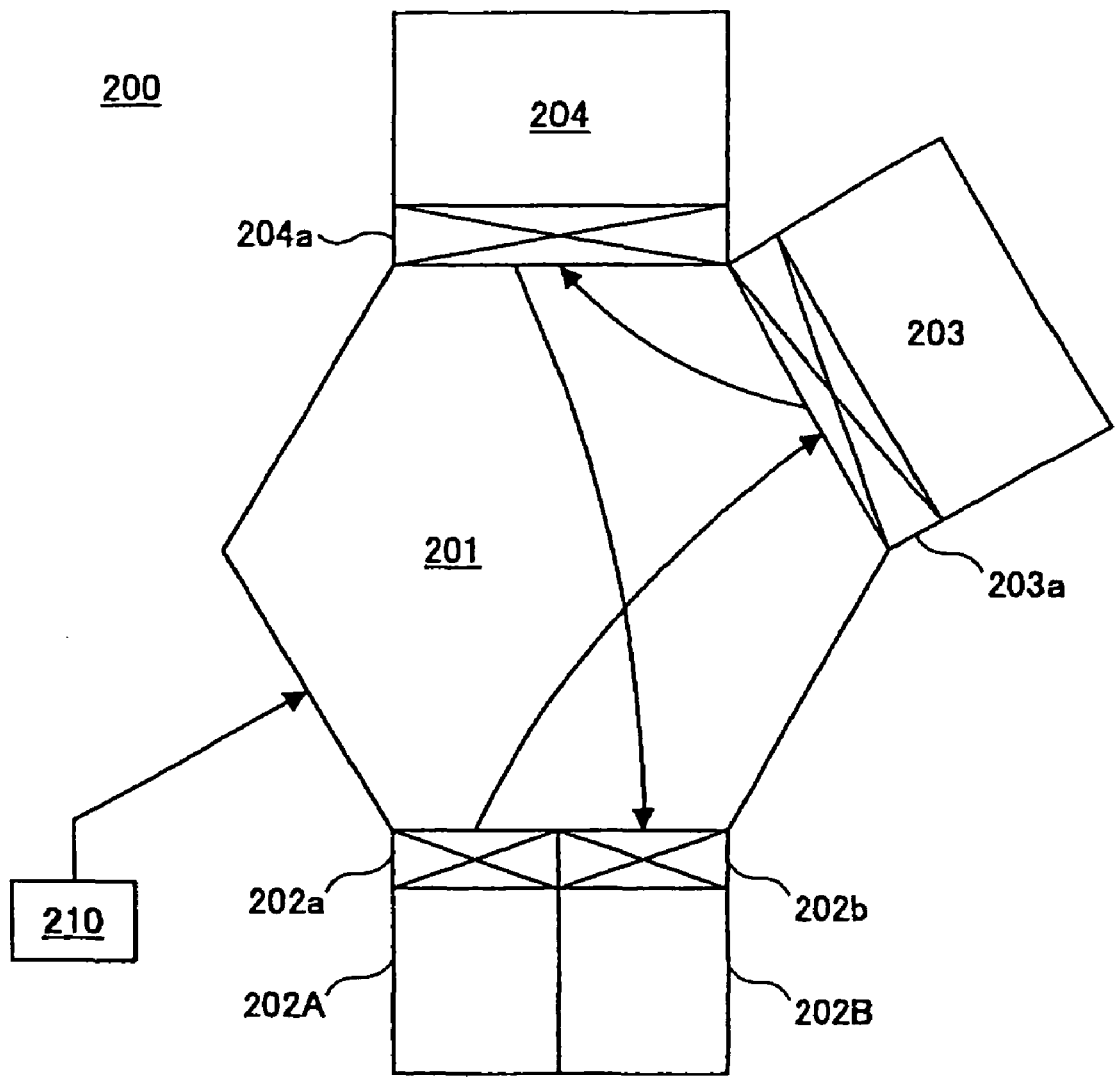
FIG. 14 is a diagram showing an example of construction of a cluster-type substrate processing apparatus configured to perform the film forming method of each embodiment of the present invention.

FIG. 14 is a diagram showing an example of construction of a cluster-type substrate processing apparatus configured for performing the film forming method of each embodiment of the present invention.

The cluster-type substrate processing apparatus 200 shown in FIG. 14 includes a vacuum transferring chamber 201 having a substrate carrying mechanism, not shown. To the vacuum transferring chamber 201, load lock chambers 202A, 202B are connected via gate valves 202a, 202b, respectively. Additionally, the parallel-plate type plasma substrate processing apparatus 11 shown in FIG. 3 is connected, as a processing chamber 203, to the vacuum transferring chamber 201, via a gate valve 203a. Furthermore, the microwave plasma processing apparatus 50 shown in FIGS. 4 and 5 is connected, as a processing chamber 204, to the vacuum transferring chamber 201, via a gate valve 204a.

A controller 210 is also provided to the cluster-type substrate processing apparatus 200 shown in FIG. 14. The controller 210 controls the substrate carrying mechanism such that the substrate to be processed, which has been introduced into the load lock chamber 202A or the load lock chamber 202B, is first carried into the processing chamber 203 via the vacuum transferring chamber 201. Then, in the parallel-plate type plasma substrate processing apparatus 11, the film forming process (deposition process) is carried out as described with reference to FIG. 1A or FIGS. 8A, 8B, etc. At this time, the controller 210 performs the function of the control unit 34 shown in FIG. 3.

Subsequently, under a control of the controller 210, the substrate to be processed is transferred from the processing chamber 203 to the processing chamber 204 via the vacuum transferring chamber 201 (and gate valves 203a, 204a). Thereafter, in the microwave plasma processing apparatus 50, the hydrogen plasma process is carried out as described with reference to FIG. 1B or FIG. 8C, etc.

Moreover, if required, under a control of the controller 210, the parallel-plate type plasma substrate processing apparatus 11 and the microwave plasma processing apparatus 50 repeatedly perform the steps shown in FIGS. 1C to 2F (or FIGS. 8D to 10I), respectively.

Figure 15:
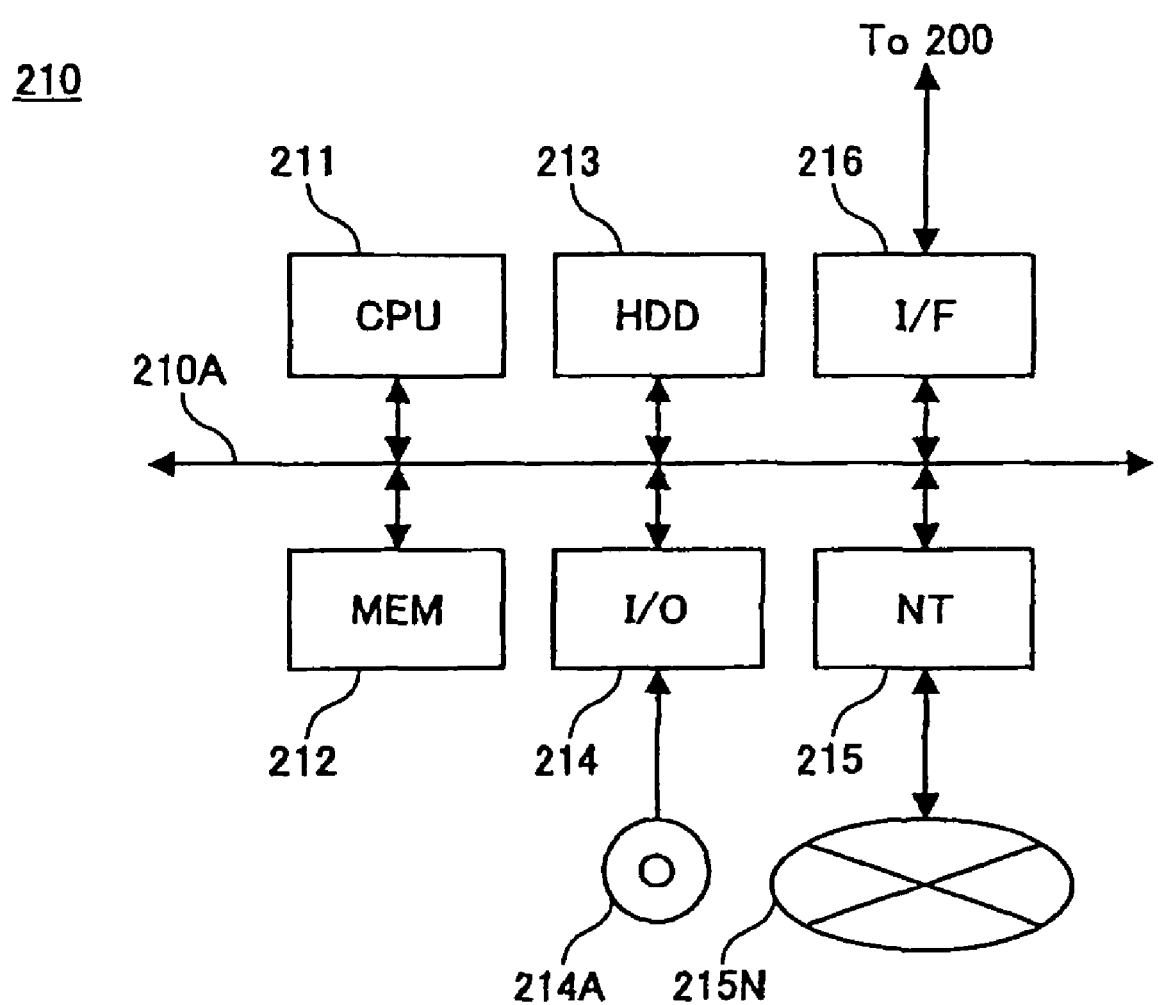
FIG. 15 is a diagram showing an example of construction of a controller for controlling the cluster-type substrate processing apparatus of FIG. 14.

FIG. 15 schematically shows an example of construction of the controller 210.

The controller 210 shown in FIG. 15 is composed of a general-purpose computer, and includes a system bus 210A. To the system bus 210A, a CPU 211, a memory 212, a hard disk drive 213, an input/output unit 214 including a key board, a mouse, a display and the like, a network interface 215 connected with a network 215N, and a control interface 216 connected with the cluster-type substrate processing apparatus 200 are connected, respectively.

Under a control of the CPU 211, a control program code for the substrate processing apparatus 200 stored (or saved) in a processor-readable medium (storage medium) 214A is read via the input/output unit 214 and then stored in the hard disk drive 213. If necessary, the CPU 211 reads out the control program code stored in the hard disk drive 213 and develops or decompresses it in the memory 212. Thereafter, the CPU 211 controls the substrate processing apparatus 200 (i.e., each component thereof), via the control interface 216, in accordance with the program code developed in the memory 212.

In the controller 210 shown in FIG. 15, in place of utilizing (executing) the control program code stored in the processor-readable medium 214A, another program code similar to the control program code may be downloaded and utilized (executed) via the network 215N.

Additionally, in the controller 210 shown in FIG. 15, the control for the substrate processing apparatus 200 may be performed via the network 215N.

While preferred embodiments of the present invention have been described above, this invention is not limited to such specific embodiments. Namely, various variations and modifications can be made without departing from the spirit and scope of claims.

For instance, while a parallel-plate type plasma generator is employed herein as a plasma supply source in the substrate processing apparatus used for the deposition of the SiOCH film element, an ICP (Inductive Coupling Plasma) type plasma generator or an ECR (Electron Cyclotron Resonance) type plasma generator may also be used.

What is claimed is:

1. A film forming method for an SiOCH film, comprising a unit-film-forming step including:
   a deposition step of depositing an SiOCH film element by using an organic silicon compound as a raw material and by using a plasma CVD method; and
   a hydrogen plasma processing step of providing a hydrogen plasma process to the deposited SiOCH film element, wherein
   the unit-film-forming step is repeated several times so as to form an SiOCH film on a substrate, and
   in the deposition step of each unit-film-forming step, the SiOCH film element is deposited into a film thickness of 50 to 400 nm.

2. The film forming method according to claim 1, wherein
   in the deposition step of each unit-film-forming step, a temperature of the substrate is controlled to be a first substrate temperature within a range from a room temperature to 200° C., and
   in the hydrogen plasma processing step of each unit-film-forming step, the temperature of the substrate is controlled to be a second substrate temperature higher than the first substrate temperature.

3. The film forming method according to claim 2, wherein
   the deposition step of each unit-film-forming step is carried out by a first substrate processing apparatus, and
   the hydrogen plasma processing step of each unit-film-forming step is carried out by a second substrate processing apparatus.

4. The film forming method according to claim 1, wherein
   an insulating film selected from SiC, SiN, SiCN and SiCO is formed, in advance, on an upper surface of the substrate on which the SiOCH film is formed, and
   an oxygen plasma step of providing an oxygen plasma process to a surface of the insulating film is performed before the first unit-film-forming step.

5. The film forming method according to claim 1, wherein between the deposition step and the hydrogen plasma processing step in each unit-film-forming step, an oxygen plasma step of providing an oxygen plasma process to a surface of the SiOCH film element deposited by the deposition step is performed.

6. A film forming apparatus comprising:
   a deposition apparatus configured to deposit an SiOCH film element by using an organic silicon compound as a raw material and by using a plasma CVD method;
   a hydrogen plasma processing apparatus configured to provide a hydrogen plasma process to the deposited SiOCH film element; and
   an apparatus control unit configured to control the deposition apparatus and the hydrogen plasma processing apparatus, so as to carry out a film forming method for an SiOCH film, the method including a unit-film-forming step including: a deposition step of depositing the SiOCH film element by using the organic silicon compound as the raw material and by using the plasma CVD method; and a hydrogen plasma processing step of providing the hydrogen plasma process to the deposited SiOCH film element,
   wherein the unit-film-forming step is repeated several times so as to form an SiOCH film on a substrate,
   wherein in the deposition step of each unit-film-forming step, the SiOCH film element is deposited into a film thickness of 50 to 400 nm.

7. A storage medium storing a computer program to cause a computer to carry out a control method, wherein the control method is for controlling a film forming apparatus, the film forming apparatus including:
   a deposition apparatus configured to deposit an SiOCH film element by using an organic silicon compound as a raw material and by using a plasma CVD method; and a hydrogen plasma processing apparatus configured to provide a hydrogen plasma process to the deposited SiOCH film element, wherein the control method is for controlling the deposition apparatus and the hydrogen plasma processing apparatus, so as to carry out a film forming method for an SiOCH film, the film forming method including a unit-film-forming step including: a deposition step of depositing the SiOCH film element by using the organic silicon compound as the raw material and by using the plasma CVD method; and a hydrogen plasma processing step of providing the hydrogen plasma process to the deposited SiOCH film element, wherein the unit-film-forming step is repeated several times so as to form an SiOCH film on a substrate, and in the deposition step of each unit-film-forming step, the SiOCH film element is deposited into a film thickness of 50 to 400 nm.

* * * * *